United States Patent
Kang et al.

(10) Patent No.: US 9,422,627 B2
(45) Date of Patent: Aug. 23, 2016

(54) HARD FILM FOR CUTTING TOOL

(71) Applicant: KORLOY INC., Seoul (KR)

(72) Inventors: Jae-Hoon Kang, Cheongju-si (KR); Je-Hun Park, Cheongju-si (KR); Seung-Su Ahn, Cheongju-si (KR); Sung-Hyun Kim, Cheongju-si (KR); Jung-Wook Kim, Cheongju-si (KR); Sung-Gu Lee, Cheongju-si (KR); Sun-Yong Ahn, Cheongju-si (KR); Dong-Bok Park, Cheongju-si (KR)

(73) Assignee: KORLOY INC., Seoul (KR)

( * ) Notice: Subject to any disclaimer, the term of this patent is extended or adjusted under 35 U.S.C. 154(b) by 0 days.

(21) Appl. No.: 14/398,126

(22) PCT Filed: Mar. 18, 2013

(86) PCT No.: PCT/KR2013/002186
§ 371 (c)(1),
(2) Date: Oct. 31, 2014

(87) PCT Pub. No.: WO2013/165091
PCT Pub. Date: Nov. 7, 2013

(65) Prior Publication Data
US 2015/0152561 A1 Jun. 4, 2015

(30) Foreign Application Priority Data

May 2, 2012 (KR) ........................ 10-2012-0046530

(51) Int. Cl.
*C23C 14/06* (2006.01)
*C23C 30/00* (2006.01)
(Continued)

(52) U.S. Cl.
CPC ............... *C23C 30/005* (2013.01); *B32B 15/01* (2013.01); *C23C 14/0641* (2013.01); *C23C 28/027* (2013.01); *Y10T 428/24975* (2015.01); *Y10T 428/265* (2015.01)

(58) Field of Classification Search
USPC ............ 51/307, 309; 428/216, 336, 697, 698, 428/699
See application file for complete search history.

(56) References Cited

U.S. PATENT DOCUMENTS 6,586,122 B2 * 7/2003 Ishikawa ............... C23C 30/005
428/699
8,673,435 B2 * 3/2014 Kudo ................. C04B 35/5831
428/216

(Continued)

FOREIGN PATENT DOCUMENTS

CN    102016121 A    4/2011
CN    102268637 A    12/2011

(Continued)

*Primary Examiner* — Archene Turner
(74) *Attorney, Agent, or Firm* — Revolution IP, PLLC

(57) ABSTRACT

Provided is a hard film for a cutting tool formed on a surface of a base material, the hard film being comprised of a nano multi-layered structure formed by sequentially stacking a thin layer A, a thin layer B, a thin layer C and a thin layer D or being comprised of a structure formed by repeatedly stacking the nano multi-layered structure at least twice, wherein the thin layer A is comprised of $Ti_xAl_{1-x}N$ ($0.5 \leq x \leq 0.7$); the thin layer B is comprised of $Al_{1-y-z}Ti_yMe_zN$ ($0.4 \leq y \leq 0.7$, $0 < z \leq 0.1$ where Me is at least one of Si, Cr, and Nb); the thin layer C is comprised of $Al_aTi_{1-a}N$ ($0.5 \leq a \leq 0.7$); and the thin layer D is comprised of $Al_bCr_{1-b}N$ ($0.5 \leq b \leq 0.7$).

5 Claims, 1 Drawing Sheet

(51) Int. Cl.
    *B32B 15/01*    (2006.01)
    *C23C 28/02*    (2006.01)

(56) References Cited

U.S. PATENT DOCUMENTS

| | | | | |
|---|---|---|---|---|
| 8,852,305 | B2* | 10/2014 | Andersson | C04B 41/009 428/697 |
| 2009/0155559 | A1* | 6/2009 | Xu | C23C 30/005 428/216 |
| 2011/0033723 | A1 | 2/2011 | Kim et al. | |
| 2011/0183131 | A1 | 7/2011 | Maeda et al. | |

FOREIGN PATENT DOCUMENTS

| | | |
|---|---|---|
| JP | 2009-061520 A | 3/2009 |
| JP | 2010-207918 A | 9/2010 |
| JP | 2012-035378 A | 2/2012 |
| KR | 10-2010-0051642 A | 5/2010 |
| KR | 10-2011-0105980 A | 9/2011 |

\* cited by examiner

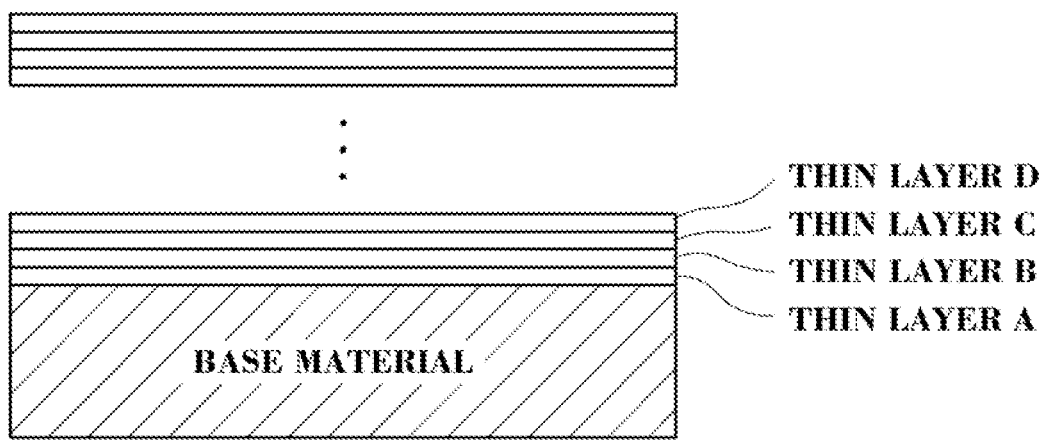

HARD FILM FOR CUTTING TOOL

CROSS REFERENCE TO PRIOR APPLICATIONS

This application is a National Stage Application of PCT International Patent Application No. PCT/KR2013/002186 filed on Mar. 18, 2013, under 35 U.S.C. §371, which claims priority to Korean Patent Application No. 10-2012-0046530 filed on May 2, 2012, which are all hereby incorporated by reference in their entirety.

TECHNICAL FIELD

The present invention relates to a hard film formed on a hard basic material such as a hard metal, a cermet, a high-speed steel, an end mill, a drill, a cNB or the like that is used in a cutting tool, and more particularly, to a hard film for a cutting tool configured with a nano multi-layered structure including a thin layer A, a thin layer B, a thin layer C and a thin layer D or a repeatedly stacked structure thereof, thus improving all of abrasion resistance, lubrication, toughness and oxidation resistance compared to an existing multi-layered thin film structure.

BACKGROUND ART

As the industry gradually advances toward fineness, speedup and mass production, it is required to improve cutting performance and life cycle of a cutting tool. Especially, since high heat of 900° C. or more is locally generated on a front end of the cutting tool rubbing with a workpiece in a rapid cutting of a workpiece having a high hardness and a cutting of a difficult-to-cut material having a low thermal conductivity, life cycle of the cutting tool may be improved by forming a hard film having excellent oxidation resistance and abrasion resistance on a cutting surface of the cutting tool.

In order to improve the cutting performance and life cycle, a single-layered hard film including TiN, $Al_2O_3$, TiAlN, AlTiN, AlCrN or the like having abrasion resistance, oxidation resistance, impact resistance and the like, or a multi-layered hard film in which the single-layered hard films are stacked in two layers or more, is formed on a hard base material such as a hard metal, a cermet, a high speed steel, an end mill, a drill, or the like to cope with demands for the high hardness workpiece and the difficult-to-cut material.

Recently, the hardness of the workpiece is gradually increased, and a demand for processing of a difficult-to-cut material having a low thermal conductivity and severely fused on a tool is also increased. Especially, since stainless steel, heat-resistant alloy steel, ductile cast iron and the like have a low thermal conductance compared to general steels, cutting heat is not emitted due to chips in a cutting and heat is concentrated on a cutting edge portion of the cutting tool, abrasion, seizure and exfoliation phenomena are easily generated on the cutting edge of the cutting tool due to a chemical reaction between the cutting tool and the workpiece, and life cycle of the cutting tool is rapidly reduced.

Therefore, only with the single layered or multi-layered structures having a composition described above, it becomes more and more difficult to cope with a demand for a cutting tool for the cutting of such a difficult-to-be cut material and ductile cast iron, which are required to evenly have characteristics such as excellent abrasion resistance, oxidation resistance and lubrication.

Therefore, trials improving the cutting performance are recently increased through a method for regularly and repeatedly stacking at least two thin films having a nano level that are different in material property.

For example, Korea Patent No. 876366 discloses a thin film structure in which a lower layer is deposited on an insert, an end mill, a drill or a cermet which is a hard metal tool through a physical vapor deposition, in order to improve an adhesion force and align the orientation of crystal grains in the direction of (200) plane, a (Ti,Al)N multi-layered thin film which is a middle layer is continuously deposited in order to improve impact resistance and chipping resistance, and a top layer which is comprised of TiAlN or AlTiSiN, is constituted by layer A, layer B, layer C and layer D and has a structure in which layer A, layer B, layer C and layer D are alternately stacked, is formed to improve the abrasion resistance and oxidation resistance of the top layer.

While the abrasion resistance and oxidation resistance may be improved through the multi-layered structure as described above, development of a hard film having a novel structure is required in order to evenly improve various characteristics such as abrasion resistance, impact resistance (toughness) and chipping resistance required for the cutting

DISCLOSURE

Technical Problem

The present invention provides a hard film for a cutting tool by which abrasion resistance, lubrication, toughness (impact resistance) and oxidation resistance are generally improved.

Technical Solution

According to an embodiment of the present invention, a hard film for a cutting tool formed on a surface of a base material, the hard film is comprised of a nano multi-layered structure formed by sequentially stacking a thin layer A, a thin layer B, a thin layer C and a thin layer D or is comprised of a structure formed by stacking the nano multi-layered structure at least twice, wherein the thin layer A is comprised of $Ti_xAl_{1-x}N$ ($0.5 \leq x \leq 0.7$); the thin layer B is comprised of $Al_{1-y-z}Ti_yMe_zN$ ($0.4 \leq y \leq 0.7$, $0 < z \leq 0.1$ where Me is at least one of Si, Cr, and Nb); the thin layer C is comprised of $Al_aTi_{1-a}N$ ($0.5 \leq a \leq 0.7$); and the thin layer D is comprised of $Al_bCr_{1-b}N$ ($0.5 \leq b \leq 0.7$).

According to another embodiment of the present invention, it is preferable that each of the thin layer A, the thin layer B, the thin layer C and the thin layer D have an average thickness of 3 nm to 50 nm.

According to another embodiment of the present invention, it is preferable that each of the thin layer A, the thin layer B, the thin layer C and the thin layer D have an average thickness of 20 nm to 40 nm.

According to another embodiment of the present invention, it is preferable that the hard film have an average thickness of 1 μm to 20 μm.

According to another embodiment of the present invention, it is preferable that the hard film have degradation hardness degradation-treated at a temperature of 900° C. for 30 minutes, which is 35 GPa or more.

Advantageous Effects

According to a hard film for a cutting tool of the present invention, since various characteristics required for a hard film for a cutting tool, such as abrasion resistance, lubrication, toughness, chipping resistance, and oxidation resistance, may be evenly improved through a repeated stacking of a nano multi-layered structure formed by sequentially stacking, in order of a thin layer A-B-C-B, a Ti and Al composite nitride layer (a thin layer A) having excellent adhesion to a base material and excellent abrasion resistance commonly, an Al, Ti and at least one of Si, Cr, and Nb composite nitride layer (a thin layer B) having excellent abrasion resistance due to an increment in thin film hardness by a solid solution reinforcement effect of Si, Cr, and Nb, and more highly improved in oxidation resistance due to oxides rapidly formed by solid solution elements under a high temperature environment, an Al and Ti composite nitride layer (a thin layer C) having excellent abrasion resistance and an Al and Cr composite nitride layer (a thin layer D) suppressing crack propagation and having excellent lubrication, the hard film for the cutting tool may be suitably used in processing of a difficult-to-cut material.

That is, in the hard film for the cutting tool of the present invention, thin layers for reinforcing hardness, oxidation resistance and lubrication of each thin layer are periodically and repeatedly stacked in order of the thin layer A-B-C-D to maximize the functions of the respective thin layers, thus capable of harmoniously improving abrasion resistance, lubrication, toughness, chipping resistance and oxidation resistance required for a cutting the difficult-to-cut material.

DESCRIPTION OF DRAWINGS

FIG. 1 is a schematic cross-sectional view illustrating a structure of a hard film for a cutting tool according to the present invention.

BEST MODE

Hereinafter, embodiments of the present invention will be described with reference to the accompanying drawings to fully explain the present invention in such a manner that it may easily be carried out by a person with ordinary skill in the art to which the present invention pertains. The present invention may, however, be embodied in different forms and should not be construed as limited to the embodiments set forth herein. Also, in the figures, the dimensions of layers and regions are exaggerated for clarity of illustration.

FIG. 1 is a schematic cross-sectional view illustrating a structure of a hard film for a cutting tool according to the present invention. As illustrated in FIG. 1, a thin film for a cutting tool has a structure in which a thin layer A, a thin layer B, a thin layer C and a thin layer D are sequentially stacked on a base material to form a nano multi-layered structure, and the nano multi-layered structure is repeatedly stacked twice or more.

The thin layer A and the thin layer C are a thin layer aiming to mainly improve an adhesion to a base material, abrasion resistance and hardness, and are comprised of $Ti_{1-x}Al_xN$ ($0.5 \leq x \leq 0.7$) and $Al_aTi_{1-a}N$ ($0.5 \leq a \leq 0.7$), respectively.

The thin layer A and the thin layer C contain a ratio of 0.5 to 0.7 of Ti and Al, and are comprised of Ti-rich Ti and Al composite nitride and Al-rich Al and Ti composite nitride, respectively. In TiAlN, when a content of a Ti element is more than that of an Al element, toughness is increased, and hardness is relatively reduced, and when a content of an Al element is more than that of a Ti element, hardness is increased, and toughness is reduced.

Therefore, the thin layer A and the thin layer C are comprised of Ti and Al composite nitride having high toughness and Ti and Al composite nitride having high hardness, and are alternately stacked with the thin layer B or the thin layer C in-between to form a hard film harmoniously improved in toughness and hardness.

Meanwhile, in the thin layer A, when a Ti content is more than 0.7 (and Al content is less than 0.3), since Al having an atomic radius smaller than that of Ti, is substituted, and thus a solid solution amount of Al is decreased, abrasion resistance and hardness of the thin film are reduced, and since a $TiO_2$ oxide is easily formed under a high temperature environment in a cutting, a Ti atom in the thin film may be diffused to the outside to incur a high temperature hardness reduction due depletion of the Ti atom, which is not preferable.

Also, in the thin layer B, when an Al content is more than 0.7 (and a Ti content is less than 0.3), since a phase having a hexagonal B4 structure is formed, brittleness is increased to reduce abrasion resistance and life cycle of a tool, which is not preferable.

Therefore, in the thin layer A and the thin layer B, it is preferable that each of Ti and Al contents be limited so as not to be more than 0.7.

Like this, the thin layer A and the thin layer C comprised of Ti and Al composite nitride form a multi-layer having a nano level together with thin films having a different composition, and thus allow a hard film for a cutting tool according to the present invention to have a characteristic evenly and highly balanced in various terms of abrasion resistance, toughness, chipping resistance, and lubrication.

Meanwhile, since the thin layer A has a low residual stress compared to other thin layers to have a high adhesion force to a base material, it is preferable that the thin layer A be formed on the base material. However, since the thin layer B and the thin layer C are a high hardness functional layer and have a high compressive residual stress due to a solid solution reinforcement effect of each atoms (generally, in a case of a PVD thin layer, the higher thin film hardness, the higher the compressive residual stress is), when such a thin layer B and thin layer C are formed on the base material, an adhesion force of the hard film is reduced due to a compressive stress difference between the base material and the thin layer, which is not preferable.

The thin layer B is a thin layer aiming to mainly improve abrasion resistance and oxidation resistance, and is comprised of a composition of $Al_{1-y-z}Ti_yMe_zN$ ($0.4 \leq y \leq 0.7$, $0 < z \leq 0.1$ where Me is at least one of Si, Cr, and Nb).

In the thin layer B, it is preferable that a Ti content be 0.4 to 0.7, and the reason is that when a Tl content is less than 0.3, a phase having a B4 hexagonal structure increases brittleness and reduces abrasion resistance and life cycle of a tool, and when a Ti content is more than 0.7, Al having an atomic radius smaller than that of Ti, is substituted to reduce a solid solution amount of Al, thus reducing hardness and abrasion resistance of a thin film, and $TiO_2$ oxide is easily formed under a high temperature environment in a cutting, so that a Ti atom in the thin film may be diffused to the outside to incur a high temperature hardness reduction due to the depletion of the Ti atom.

Also, the thin layer B contains 0.1 or less of at least one of Si, Cr, and Nb, and when the thin layer B contains at lest one of Si, Cr, and Nb in the above-described content, dual oxides, such as $Si_2O_3$, $Cr_2O_3$ or $Nb_2O_3$ including an $Al_2O_3$ oxidized layer are formed, and thus oxidation resistance of the hard film may be considerably improved. In this manner, at least one of Si, Cr, and Nb may be solid-solutioned in a crystalline structure of AlTiN to improve oxidation resistance and hardness (especially, degradation hardness) of the thin film.

However, when a content of at least one of Si, Cr, and Nb is more than 0.1, a coarse thin film structure is formed and concurrently, if the tool is exposed to a high temperature environment in a cutting, segregation of $Cr_2N$ or like is formed to reduce abrasion resistance and life cycle of the tool is decreased. Accordingly, it is preferable that the content be limited to 0.1 or less.

The thin layer D is a thin layer aiming to mainly improve abrasion resistance and toughness (impact resistance) and suppress crack propagation, and has a composition that is comprised of $Al_bCr_{1-b}N$ ($0.5 \leq b \leq 0.7$).

In the thin layer D, it is preferable that an Al content be 0.5 to 0.7, and the reason is that when an Al content is less than 0.5, that is, a Cr content is 0.5 or more, a coarse thin film structure is formed, and concurrently, segregation of $Cr_2N$ is formed in an operation, such as a cutting followed by high temperature to reduce abrasion resistance and life cycle of the tool, thus it is not preferable, and when an Al content is more than 0.7, that is, a Cr content is 0.3 or less, insulation is increased and thus DC deposition is difficult due to a characteristic of equipment, and hcp-AlCrN instead of fcc-AlCrN is formed to increase brittleness and to reduce toughness, abrasion resistance and life cycle of the tool, which is not preferable.

Meanwhile, it is preferable that the thin layer A, the thin layer B, the thin layer C, and the thin layer D have an average thickness of 3 nm to 50 nm.

This is because as the period of a nano multi-layered structure is decreased, occurrence and movement of dislocation are suppressed, and thus a thin film is reinforced, and when the thickness of the thin film is as thin as less more 3 nm, a mixing zone is formed by interdiffusion between two layers to reduce hardness and an elastic modulus while a boundary between the nano multi-layers for suppressing the occurrence and movement of the dislocation becomes unclear, so it is preferable that the thin film be formed in a thickness not less than 3 nm, and when the thickness is more than 50 nm, the occurrence and movement of the dislocation are easier, so that hardness and an elastic modulus are reduced and also coherency strain energy is reduced by formation of misfit dislocation, so that a reinforcement effect reduction phenomenon is accompanied, which is not preferable.

Also, it has been confirmed through an experiment in which only thicknesses of the layers are changed that since an excellent grain boundary reinforcement effect for suppressing movement of dislocation may be obtained through plastic deformation when thicknesses of the thin layer A, the thin layer B, the thin layer C, and the thin layer D are in a range of 20 nm to 40 nm, this thickness range is most preferable.

In preferable Examples of the present invention, when the thin layer A commonly having excellent adhesion force and abrasion resistance and toughness, the thin layer B improving abrasion resistance and oxidation resistance through a solid solution reinforcement effect by a solid solution element, the thin layer C that is a functional layer additionally complementing abrasion resistance, and the thin layer D functioning as a layer improving toughness and lubrication of a thin layer A-B-C are sequentially stacked to realize a nano multi-layered structure of A-B-C-D, weaknesses of each of the thin layers may be offset and complemented to harmoniously improve abrasion resistance, oxidation resistance, toughness and lubrication.

Especially, since abrasion resistance and toughness that are relative characteristics to each other may be improved at the same time through a structure in which a stacking is realized while thin film hardness (and a residual stress) of each layer influencing abrasion resistance and toughness of each thin layer is periodically oscillated, it is most preferable that a hard film for a cutting tool according to the present invention be realized in a nano multi-layered structure of thin layers A-B-C-D.

Like this, it is most preferable that the thin film for the cutting tool according to the present invention having a nano multi-layered structure or a structure in which the nano multi-layered structure is repeatedly stacked at least twice, have an average thickness of 1 μm to 20 μm.

As described above, the present invention forms the nano multi-layered structure by sequentially stacking a TiAlN, an AlTiMeN (where Me is at least one of Si, Cr, and Nb) thin layer, and an AlTiN-based thin layer, and any one of an NbN thin layer, a VN thin layer and a CrN thin layer, and is in evenly improving abrasion resistance, lubrication, toughness, chipping resistance and oxidation resistance with respect to an entire hard film.

EXAMPLES

In the present invention, a hard film was coated on a surface of a hard base material of WC-10 wt % Co by using an arc ion plating method that is a physical vapor deposition (PVD), the hard base material including a cermet, high speed steel, an end mill, drill or the like. In the coating, a TiAl target, an AlTiSi, AlTiCr or TiAlNb target, an AlTi target, and an AlCr target were used with respect to a thin layer A, a thin layer B, a thin layer C, and a thin layer D, respectively. An initial pressure was reduced to $8.5 \times 10^{-5}$ Torr or less, and $N_2$ was introduced as a reaction gas. A gas pressure for coating was 30 mTorr or less and preferably 20 mTorr or less, a coating temperature was 400° C. to 550° C., and a substrate bias voltage was applied in −20 V to −150 V. Of course, the coating condition may be different from that of Example of the present invention according to an equipment characteristic and condition.

In Example of the present invention, a TiAlN film, an AlTi(Si,Cr,Nb)N film, an AlTiN film, and an AlCrN film were sequentially stacked at an average thickness of 25 nm to 45 nm to form a nano multi-layered structure, and then such a nano multi-layered structure was repeatedly formed to manufacture a hard film for a cutting tool having a total thickness of 4.2 μm to 4.5 μm according to Example of the present invention.

Meanwhile, if necessary, it goes without saying that various types of thin film may be additionally formed on a hard film for a cutting tool formed according to Example of the present invention. Also, since a hard film for a cutting tool according to Example of the present invention is formed by using a physical vapor deposition (PVD), a thin film thickness may be formed up to 20 μm.

The following Table 1 shows each of a composition, a target composition ratio, thin film average thickness, a total film thickness and a stack structure with respect to a hard film for a cutting tool according to Example of the present invention.

TABLE 1

| | Structure of Hard Film | | | |
|---|---|---|---|---|
| Example No. | Nano Multi-layered Structure (Target Composition Ratio) | Thin Layer Average Thickness (nm) | Total Film Thickness (μm) | Stack Structure |
| 1 | TiAlN(5:5)/AlTiSiN(58:37:5)/ AlTiN(67:33)/AlCrN(7:3) | 25 | 4.2 | A/B/C/D Nano Multi-layer |
| 2 | TiAlN(5:5)/AlTiSiN(58:37:5)/ AlTiN(67:33)/AlCrN(5:5)) | 27 | 4.3 | A/B/C/D Nano Multi-layer |

TABLE 1-continued

| Example No. | Nano Multi-layered Structure (Target Composition Ratio) | Thin Layer Average Thickness (nm) | Total Film Thickness (μm) | Stack Structure |
|---|---|---|---|---|
| 3 | TiAlN(5:5)/AlTiCrN(54:38:8)/ AlTiN(67:33)/AlCrN(7:3) | 35 | 4.4 | A/B/C/D Nano Multi-layer |
| 4 | TiAlN(5:5)/AlTiCrN(54:38:8)/ AlTiN(67:33)/AlCrN(5:5) | 37 | 4.4 | A/B/C/D Nano Multi-layer |
| 5 | TiAlN(5:5)/AlTiNbN(40:50:10)/ AlTiN(67:33)/AlCrN(7:3) | 45 | 4.5 | A/B/C/D Nano Multi-layer |
| 6 | TiAlN(5:5)/AlTiNbN(40:50:10)/ AlTiN(67:33)/AlCrN(5:5) | 42 | 4.4 | A/B/C/D Nano Multi-layer |

Also, in order to relatively evaluate characteristics of hard films for a cutting tool formed according to Examples of the present invention, hard films having the almost same thickness as Examples of the present invention were formed in thin film structures shown the following Table 2 on a base material of WC-10 wt % Co equal to that of Examples of the present invention.

TABLE 2

| Comparative Example No. | Nano Multi-layered Structure | Thin Layer Average Thickness (nm) | Total Film Thickness (μm) | Stack Structure |
|---|---|---|---|---|
| 1 | TiAlN(5:5) | | 4.3 | Single Layer |
| 2 | AlTiN(67:33) | | 4.2 | Single Layer |
| 3 | AlCrN(5:5) | | 4.1 | Single Layer |
| 4 | AlCrN(7:3) | | 4.3 | Single Layer |
| 5 | AlTiSiN(58:37:5) | | 4.2 | Single Layer |
| 6 | AlTiCrN(54:38:8) | | 4.2 | Single Layer |
| 7 | TiAlNbN(50:40:10) | | 4.1 | Single Layer |
| 8 | TiAlN(5:5)/AlCrN(7:3) | 40 | 4.3 | A/B Nano Multi-layer |
| 9 | TiAlN(5:5)/AlCrN(5:5) | 47 | 4.4 | A/B Nano Multi-layer |
| 10 | AlTiN(67:33)/AlCrN(5:5) | 23 | 4.2 | A/B Nano Multi-layer |
| 11 | TiAlN(5:5)/AlTiSiN(58:37:5) | 23 | 4.2 | A/B Nano Multi-layer |
| 12 | TiAlN(5:5)/AlTiCrN(54:38:8) | 32 | 4.3 | A/B Nano Multi-layer |
| 13 | TiAlN(5:5)/AlTiNbN(40:50:10) | 42 | 4.0 | A/B Nano Multi-layer |

As confirmed in Table 2, in Comparative Examples 1 to 7, each thin films used in Examples of the present invention were used to form hard films having a total thickness of 4.1 μm to 4.3 μm in a single-layered type, and in Comparative Examples 8 to 13, two thin films of thin films used in Example of the present invention were selected and alternately stacked at an average thickness of 23 nm to 47 nm to form hard films having an A/B nano multi-layered structure and a total thickness of 4.0 μm to 4.4 μm, and theses hard films are to confirm a cutting performance difference according to a nano multi-layer composition (where some thin films are excepted) difference and a stack structure difference from hard films for a cutting tool according to Examples of the present invention.

The following Tables 3 and 4 show measurement results of real compositions of thin films constituting each layer measured by using an energy dispersive X-ray spectrometer (EDX) after hard films for a cutting tool according to Examples of the present invention and Comparative Examples were formed.

TABLE 3

| Example No. | Nano Multi-layered Structure (Target Composition Ratio) | Thin Film Composition (EDX, at %) | | | | | |
|---|---|---|---|---|---|---|---|
| | | Al | Ti | Cr | Si | Nb | N |
| 1 | TiAlN(5:5)/ AlTiSiN(58:37:5)/ AlTiN(67:33)/AlCrN(7:3) | 31.1 | 18.2 | 5.2 | 1.8 | | 43.7 |
| 2 | TiAlN(5:5)/ AlTiSiN(58:37:5)/ AlTiN(67:33)/AlCrN(5:5) | 27.4 | 18.4 | 7.5 | 1.9 | | 44.8 |
| 3 | TiAlN(5:5)/ AlTiCrN(54:38:8)/ AlTiN(67:33)/AlCrN(7:3) | 29.4 | 15.1 | 8.9 | | | 16.6 |
| 4 | TiAlN(5:5)/ AlTiCrN(54:38:8)/ AlTiN(67:33)/AlCrN(5:5) | 27.4 | 16.6 | 9.5 | | | 16.5 |
| 5 | TiAlN(5:5)/ AlTiNbN(40:50:10)/ AlTiN(67:33)/AlCrN(7:3) | 24.3 | 21.2 | 6.2 | | 4.2 | 44.1 |
| 6 | TiAlN(5:5)/ AlTiNbN(40:50:10)/ AlTiN(67:33)/AlCrN(5:5) | 22.2 | 22.8 | 7.4 | | 4.3 | 43.3 |

TABLE 4

| Comparative Example No. | Nano Multi-layered Structure (Target Composition Ratio) | Thin Film Composition (EDX, at %) | | | | | |
|---|---|---|---|---|---|---|---|
| | | Al | Ti | Cr | Si | Nb | N |
| 1 | TiAlN(5:5) | 27.1 | 28.9 | | | | 44 |
| 2 | AlTiN(67:33) | 37.4 | 19.4 | | | | 43.2 |
| 3 | AlCrN(5:5) | 26.6 | | 28.9 | | | 44.5 |
| 4 | AlCrN(7:3) | 35.8 | | 18.5 | | | 45.7 |
| 5 | AlTiSiN(58:37:5) | 34.2 | 20 | | 2 | | 43.8 |
| 6 | AlTiCrN(54:38:8) | 28.7 | 19.4 | 6.7 | | | 45.2 |
| 7 | TiAlNbN(50:40:10) | 29.3 | 18.9 | | | 6.2 | 45.6 |
| 8 | TiAlN(5:5)/ AlCrN(7:3) | 27.8 | 10.6 | 14.3 | | | 47.3 |
| 9 | TiAlN(5:5)/ AlCrN(5:5) | 30.2 | 16.6 | 10.1 | | | 43.1 |
| 10 | AlTiN(67:33)/ AlCrN(5:5) | 31.4 | 9.2 | 14.7 | | | 44.7 |
| 11 | TiAlN(5:5)/ AlTiSiN(58:37:5) | 29.4 | 23.5 | | 1.8 | | 45.3 |
| 12 | TiAlN(5:5)/ AlTiCrN(54:38:8) | 25.3 | 22.6 | 5.4 | | | 46.7 |
| 13 | TiAlN(5:5)/ AlTiNbN(40:50:10) | 25.5 | 22 | | | 6.1 | 46.4 |

As confirmed in Table 3 described above, the formed hard films for a cutting tool have real compositions that are somewhat different from target compositions, but almost similar to the target compositions.

Evaluation of Room Temperature Hardness, Degradation Hardness, Friction Coefficient and Crack Length In order to compare and evaluate Examples 1 to 6 of the present invention and Comparative Examples 1 to 13 formed as described above, a microhardness test was performed using a Fisher scope (model name "HP100C-XYP"; Germany HELMUT FISCHER GMBH, ISO14577), and room temperature hardness directly after forming hard films and degradation hardness after a high temperature degradation treatment at a temperature of 900° C. for 30 minutes was measured, respectively.

Such a microhardness test was performed under conditions of a load of 30 mN, an unload of 30 mN, a load time of 10 sec, and a creep time of 5 sec Also, in order to evaluate a friction characteristic of the hard films, a sliding distance (60 revolutions of a ball (where a material is Si3N4, a diameter is 4 mm, and hardness is HV50 g1600) was measured through a ball-on-disc test by using a CETR UMT-2 micro-tribometer. At this time, the measurement was performed under conditions of a temperature of 20° C. to 25° C., a relative humidity of 50% to 60%, and a rotation speed of 318 rpm (10 m/min).

Also, in or der to evaluate toughness (crack resistance) of the hard film, a length of a crack generated on the hard film was measured by applying a diamond pressure mark having a load of 30 kgf.

Measurement results of room temperature hardness, degradation hardness, a friction coefficient and a crack length obtained with respect to Examples 1 to 6 of the present invention and Comparative Examples 1 to 13 are shown in Tables 5 and 6, respectively.

room temperature hardness of 29.5 GPa to 35.5 GPa which is very low compared to a room temperature hardness of 36.5 GPa to 38.4 GPa of Examples 1 to 6 of the present invention, and especially, have a degradation hardness of 24 GPa to 34.7 GPa all of which are or less 35 GPa and is very low compared to the degradation hardness of 35.1 GPa to 38 GPa of Examples 1 to 6 of the present invention, and therefore, it may be confirmed that hardness is remarkably reduced under a high temperature degradation environment.

Also, it may be confirmed that most of Comparative Examples 1 to 7 have a friction coefficient of 0.41 to 0.72 except for Comparative Examples 3 and 4 comprised of only AlCrN capable of maximizing lubrication, which is high compared to a friction coefficient of 0.32 to 0.47 of Examples 1 to 6 of the present invention.

Furthermore, Comparative Examples 1 to 7 have a crack length of 46 μm to 64 μm, whereas Examples 1 to 6 of the present invention have a crack length of 42 μm to 47 μm, and therefore it has been confirmed that the hard films for a cutting tool according to Examples of the present invention are excellent in toughness.

As described above, it may be confirmed that Comparative Examples 1 to 7 comprised of a single layer are excellent in only a specific characteristic according to a composition

TABLE 5

| Example No. | Nano Multi-layered Structure (Target Composition Ratio) | Room Temperature Hardness (GPa) | Degradation Hardness GPa) | Friction Coefficient (COF) | Crack Length (μm) |
| --- | --- | --- | --- | --- | --- |
| 1 | TiAlN(5:5)/AlTiSiN(58:37:5)/AlTiN(67:33)/AlCrN(7:3) | 37.6 | 37.4 | 0.47 | 43 |
| 2 | TiAlN(5:5)/AlTiSiN(58:37:5)/AlTiN(67:33)/AlCrN(5:5) | 38.3 | 38 | 0.39 | 45 |
| 3 | TiAlN(5:5)/AlTiCrN(54:38:8)/AlTiN(67:33)/AlCrN(7:3) | 38.4 | 36.9 | 0.46 | 43 |
| 4 | TiAlN(5:5)/AlTiCrN(54:38:8)/AlTiN(67:33)/AlCrN(5:5) | 37.3 | 36.1 | 0.35 | 46 |
| 5 | TiAlN(5:5)/AlTiNbN(40:50:10)/AlTiN(67:33)/AlCrN(7:3) | 36.5 | 35.1 | 0.36 | 47 |
| 6 | TiAlN(5:5)/AlTiNbN(40:50:10)/AlTiN(67:33)/AlCrN(5:5) | 36.9 | 35.7 | 0.32 | 42 |

TABLE 6

| Comparative Example No. | Nano Multi-layered Structure (Target Composition Ratio) | Room Temperature Hardness (GPa) | Degradation Hardness GPa) | Friction Coefficient (COF) | Crack Length (μm) |
| --- | --- | --- | --- | --- | --- |
| 1 | TiAlN(5:5) | 32.4 | 24 | 0.70 | 64 |
| 2 | AlTiN(67:33) | 35.5 | 29 | 0.72 | 64 |
| 3 | AlCrN(5:5) | 31.1 | 27 | 0.32 | 46 |
| 4 | AlCrN(7:3) | 29.5 | 25.5 | 0.31 | 48 |
| 5 | AlTiSiN(58:37:5) | 35.4 | 34.7 | 0.51 | 58 |
| 6 | AlTiCrN(54:38:8) | 35.2 | 34.1 | 0.43 | 59 |
| 7 | TiAlNbN(50:40:10) | 34.8 | 31.1 | 0.41 | 58 |
| 8 | TiAlN(5:5)/AlCrN(7:3) | 35 | 32.1 | 0.46 | 44 |
| 9 | TiAlN(5:5)/AlCrN(5:5) | 34.5 | 31.4 | 0.6 | 43 |
| 10 | AlTiN(67:33)/AlCrN(5:5) | 34.7 | 33.2 | 0.67 | 49 |
| 11 | TiAlN(5:5)/AlTiSiN(58:37:5) | 36.3 | 35.7 | 0.4 | 64 |
| 12 | TiAlN(5:5)/AlTiCrN(54:38:8) | 35.9 | 34.7 | 0.43 | 53 |
| 13 | TiAlN(5:5)/AlTiNbN(40:50:10) | 36.9 | 32.1 | 0.46 | 54 |

As confirmed in Tables 5 and 6, the hard films in which any one thin layer of nano multi-layer compositions used in the hard films for a cutting tool according to Examples of the present invention, is formed in a single-layered type, have a forming a relevant layer. For example, Comparative Examples 3 and 4 having excellent lubrication have room temperature hardness and degradation hardness of 25.5 GPa to 31.1 GPa which is very low, and Comparative Examples 5 to 7 having relatively excellent room temperature hardness and degradation hardness have a crack length of almost 60 μm.

Meanwhile, in Comparative Examples 8 to 13, the hard films formed in an alternate stack structure by selecting two thin layers of nano multi-layered compositions used in hard films for a cutting tool according to Examples of the present invention, have room temperature hardness of 34.5 GPa to 36.9 GPa which is high compared to Comparative Examples 1 to 7, but is still low compared to room temperature hardness of 36.5 GPa to 38.4 GPa of Examples 1 to 6 of the present invention, and have degradation hardness of 31.4 GPa to 35.7 GPa which is very low compared to degradation hardness of 35.1 GPa to 38 GPa of Examples 1 to 6 of the present invention, and therefore, it may be confirmed that hardness is remarkably reduced under a high temperature degradation environment.

Also, Comparative Examples 8 and 13 have a friction coefficient of 0.4 to 0.67 which is very high compared to a friction coefficient of 0.32 to 0.47 of Examples 1 to 6 of the present invention, and therefore lubrication thereof is very low compared to Examples 1 to 6 of the present invention.

Also, Comparative Examples 8 and 13 have a crack length of 43 μm to 64 μm which is very long compared to a crack length of 42 μm to 47 μm of Examples 1 to 6 of the present invention, and therefore, it has been confirmed that the hard films for a cutting tool according to Examples of the present invention are excellent is toughness.

It may be seen that the hard films of Examples 1 to of the present invention have hardness, lubrication (friction coefficient) and toughness (crack resistant) evenly improved compared to the hard films of Comparative Examples 1 to 13 from evaluations with respect to physical properties of the hard films described above.

Evaluation of Abrasion Resistance

In order to evaluate cutting performance when the hard films of Examples 1 to 6 of the present invention and Comparative Examples 1 to 13 are used in a cutting requiring for especially abrasion resistance, a milling cutting test was performed under conditions of a workpiece: alloy steel (SM45C, a milling process), a Sample Type No. SPKN1504EDSR (ISO), a cutting speed: 200 m/min, a cutting feed rate: 0.3 mm/tooth, and a cutting depth: 2 mm, and results are respectively shown in the following Tables 7 and 8.

TABLE 7

| Example No. | Nano Multi-layered Structure (Target Composition Ratio) | Cutting Life cycle (cutting length · M) | Life cycle End Factor |
|---|---|---|---|
| 1 | TiAlN(5:5)/AlTiSiN(58:37:5)/AlTiN(67:33)/AlCrN(7:3) | 18.2 | normal abrasion |
| 2 | TiAlN(5:5)/AlTiSiN(58:37:5)/AlTiN(67:33)/AlCrN(5:5) | 16.4 | normal abrasion |
| 3 | TiAlN(5:5)/AlTiCrN(54:38:8)/AlTiN(67:33)/AlCrN(7:3) | 17.8 | normal abrasion |
| 4 | TiAlN(5:5)/AlTiCrN(54:38:8)/AlTiN(67:33)/AlCrN(5:5) | 14.8 | normal abrasion |
| 5 | TiAlN(5:5)/AlTiNbN(40:50:10)/AlTiN(67:33)/AlCrN(7:3) | 15 | normal abrasion |
| 6 | TiAlN(5:5)/AlTiNbN(40:50:10)/AlTiN(67:33)/AlCrN(5:5) | 16.8 | normal abrasion |

TABLE 8

| Comparative Example No. | Nano Multi-layered Structure (Target Composition Ratio) | Cutting Life cycle (cutting length · M) | Life cycle End Factor |
|---|---|---|---|
| 1 | TiAlN(5:5) | 7.8 | fracture |
| 2 | AlTiN(67:33) | 8 | chipping |
| 3 | AlCrN(5:5) | 2.5 | excessive abrasion |
| 4 | AlCrN(7:3) | 2.5 | abrasion |
| 5 | AlTiSiN(58:37:5) | 10 | chipping |
| 6 | AlTiCrN(54:38:8) | 11 | fracture |
| 7 | TiAlNbN(50:40:10) | 8 | excessive abrasion |
| 8 | TiAlN(5:5)/AlCrN(7:3) | 10 | fracture |
| 9 | TiAlN(5:5)/AlCrN(5:5) | 9.4 | chipping |
| 10 | AlTiN(67:33)/AlCrN(5:5) | 9 | fracture |
| 11 | TiAlN(5:5)/AlTiSiN(58:37:5) | 13.4 | excessive abrasion |
| 12 | TiAlN(5:5)/AlTiCrN(54:38:8) | 12.1 | excessive abrasion |
| 13 | TiAlN(5:5)/AlTiNbN(40:50:10) | 11.8 | excessive abrasion |

As confirmed in Tables 7 and 8, Examples of the present invention have cutting life of 15 m to 18.2 m all of which are 15 m or more, and a life cycle end factor corresponding to normal abrasion, however, the hard films in which any one thin layer of nano multi-layered compositions used in the hard films for a cutting tool according to Examples of the present invention is formed in a single-layered type as Comparative Examples 1 to 7, or the hard films formed in an alternative stack structure of A/B by selecting two thin layers of nano multi-layered compositions used in the hard films for a cutting tool according to Examples of the present invention, have not ended there life cycle through normal abrasion, but have ended the life cycle through fracture, abrasion or excessive abrasion, and having cutting life cycle of only 2.5 m to 13.4 m. Thus, it may be confirmed that the abrasion resistance of Comparative Examples is remarkably low compared to Examples of the present invention.

Therefore, it has been confirmed that the hard films of Examples 1 to 6 of the present invention have an excellent abrasion resistance characteristic.

Evaluation of Toughness (Impact Resistance)

In order to evaluate cutting performance when hard films of Examples 1 to 6 of the present invention and Comparative Examples 1 to 13 in a cutting condition requiring especially, toughness (impact resistance), a milling processing impact resistance cutting performance evaluation (interrupted evaluation) was performed under conditions of a workpiece: alloy steel (SCM440, 3 line diaphragm milling processing), Sample Type No. SPKN1504EDSR (ISO), cutting speed: 200 m/min, cutting feed rate: 0.2 mm/tooth, and cutting depth: 2 mm, the evaluation was performed until a fracture of an insert coated with a hard film, and the results are shown in the following Tables 9 and 10.

TABLE 9

| Example No. | Nano Multi-layered Structure (Target Composition Ratio) | Cutting Life cycle (cutting length · M) |
|---|---|---|
| 1 | TiAlN(5:5)/AlTiSiN(58:37:5)/AlTiN(67:33)/AlCrN(7:3) | 8.7 |
| 2 | TiAlN(5:5)/AlTiSiN(58:37:5)/AlTiN(67:33)/AlCrN(5:5) | 8.7 |
| 3 | TiAlN(5:5)/AlTiCrN(54:38:8)/AlTiN(67:33)/AlCrN(7:3) | 9.3 |

TABLE 9-continued

| Example No. | Nano Multi-layered Structure (Target Composition Ratio) | Cutting Life cycle (cutting length · M) |
|---|---|---|
| 4 | TiAlN(5:5)/AlTiCrN(54:38:8)/ AlTiN(67:33)/AlCrN(5:5) | 8.6 |
| 5 | TiAlN(5:5)/AlTiNbN(40:50:10)/ AlTiN(67:33)/AlCrN(7:3) | 7.1 |
| 6 | TiAlN(5:5)/AlTiNbN(40:50:10)/ AlTiN(67:33)/AlCrN(5:5) | 7.6 |

TABLE 10

| Comparative Example No. | Nano Multi-layered Structure (Target Composition Ratio) | Cutting Life cycle (cutting length · M) |
|---|---|---|
| 1 | TiAlN(5:5) | 2.9 |
| 2 | AlTiN(67:33) | 2.8 |
| 3 | AlCrN(5:5) | 0.8 |
| 4 | AlCrN(7:3) | 1 |
| 5 | AlTiSiN(58:37:5) | 3.2 |
| 6 | AlTiCrN(54:38:8) | 3 |
| 7 | TiAlNbN(50:40:10) | 1.2 |
| 8 | TiAlN(5:5)/AlCrN(7:3) | 3.6 |
| 9 | TiAlN(5:5)/AlCrN(5:5) | 4.3 |
| 10 | AlTiN(67:33)/AlCrN(5:5) | 5.4 |
| 11 | TiAlN(5:5)/AlTiSiN(58:37:5) | 6.5 |
| 12 | TiAlN(5:5)/AlTiCrN(54:38:8) | 6.7 |
| 13 | TiAlN(5:5)/AlTiNbN(40:50:10) | 5.3 |

As confirmed in Tables 9 and 10, Examples 1 to 6 of the present invention have cutting life cycle of 7.1 m to 9.3 m, all of which are 7 m or more, whereas Comparative Examples 1 to 13 have cutting life cycle of 0.8 m to 6.7 m, all of which are less than 7 m, and therefore, the hard films for a cutting tool according to Examples of the present invention show excellent impact resistant.

Evaluation of Comprehensive Cutting Performance

Generally, since a drilling has a cutting speed which is slow compared to a milling, and is performed under a wet condition, lubrication (seizure resistance) and chipping resistance are very important. In order to comprehensively evaluate lubrication, chipping resistance, abrasion resistance and toughness according to hard films of Examples 1 to 6 of the present invention and Comparative Examples 1 to 13, a drilling cutting performance evaluations were performed under conditions of a workpiece: carbon steel (SCM45C, a carbon steel drilling), Sample Type No. SPMT07T208/XOMT07T205 (indexable drill insert, 20Φ-5D), cutting speed: 150 m/min, cutting feed rate: 0.1 mm/tooth, and cutting depth: 90 mm (penetration), and the results are shown the following Tables 11 and 12.

TABLE 11

| Example No. | Nano Multi-layered Structure (Target Composition Ratio) | Cutting Life cycle (hole: 20Φ-90 mm) | Life cycle End Factor |
|---|---|---|---|
| 1 | TiAlN(5:5)/AlTiSiN(58:37:5)/ AlTiN(67:33)/AlCrN(7:3) | 264 | excessive abrasion |
| 2 | TiAlN(5:5)/AlTiSiN(58:37:5)/ AlTiN(67:33)/AlCrN(5:5) | 234 | normal abrasion |
| 3 | TiAlN(5:5)/AlTiCrN(54:38:8)/ AlTiN(67:33)/AlCrN(7:3) | 230 | normal abrasion |
| 4 | TiAlN(5:5)/AlTiCrN(54:38:8)/ AlTiN(67:33)/AlCrN(5:5) | 212 | normal abrasion |
| 5 | TiAlN(5:5)/AlTiNbN(40:50:10)/ AlTiN(67:33)/AlCrN(7:3) | 187 | normal abrasion |
| 6 | TiAlN(5:5)/AlTiNbN(40:50:10)/ AlTiN(67:33)/AlCrN(5:5) | 177 | normal abrasion |

TABLE 12

| Comparative Example No. | Nano Multi-layered Structure (Target Composition Ratio) | Cutting Life cycle (hole: 20Φ-90 mm) | Life cycle End Factor |
|---|---|---|---|
| 1 | TiAlN(5:5) | 61 | seizure/excessive abrasion |
| 2 | AlTiN(67:33) | 68 | seizure/chipping |
| 3 | AlCrN(5:5) | 18 | excessive abrasion |
| 4 | AlCrN(7:3) | 12 | excessive abrasion |
| 5 | AlTiSiN(58:37:5) | 82 | chipping |
| 6 | AlTiCrN(54:38:8) | 76 | seizure/chipping |
| 7 | TiAlNbN(50:40:10) | 45 | excessive abrasion |
| 8 | TiAlN(5:5)/AlCrN(7:3) | 107 | excessive abrasion |
| 9 | TiAlN(5:5)/AlCrN(5:5) | 104 | chipping |
| 10 | AlTiN(67:33)/AlCrN(5:5) | 111 | seizure/chipping |
| 11 | TiAlN(5:5)/AlTiSiN(58:37:5) | 164 | excessive abrasion/ chipping |
| 12 | TiAlN(5:5)/AlTiCrN(54:38:8) | 146 | excessive abrasion |
| 13 | TiAlN(5:5)/AlTiNbN(40:50:10) | 120 | excessive abrasion |

From the results of Tables 11 and 12, it is shown that the cutting tools on which the hard films of Examples 1 to 6 of the present invention are formed, have a life cycle which is considerably high compared to Comparative Examples 1 to 13.

That is, it is shown that all of Examples 1 to 16 of the present invention except for Example 1 have ended there life cycle through normal abrasion and have cutting life of 177 to 264, whereas Comparative Examples 1 to 13 have not normally ended there life cycle, ended the life cycle through seizure, chipping or excessive abrasion, and have cutting life cycle of only 12 to 164, thus the hard films of Examples 1 to 6 of the present invention show very excellent performance.

It has been confirmed that a nano-multi-layered structure formed by sequentially stacking a Ti and Al composite nitride layer (a thin layer A) having excellent adhesion to a base material and excellent abrasion resistance, an Al, Ti and any one of Si, Cr, and Nb composite nitride layer (a thin layer B) having excellent abrasion resistance and oxidation resistance improved under a high temperature environment, an Al and Ti composite nitride layer having excellent abrasion resistance, and an Al and Cr nitride layer (a thin film D) suppressing crack propagation and having excellent lubrication in order of a thin layer A-B-C-D, may evenly improve various characteristics required for a hard film for a cutting tool, such as abrasion resistance, lubrication, toughness, chipping resistance, and oxidation resistance to be suitably used in a cutting tool for a difficult-to-cut material.

While only detailed Examples of the present invention has been particularly shown and described, it will be apparent to those skilled in the art that various changes in form and details may be made therein without departing from the spirit and scope of the invention, and it is reasonable that all differences related in the modification and application thereof will belong to the following claims.

The invention claimed is:

1. A hard film for a cutting tool formed on a surface of a base material, comprising:

a nano multi-layered structure comprising a thin layer A, a thin layer B, a thin layer C and a thin layer D, which are sequentially stacked on the surface of the base material, wherein the nano multi-layered structure is repeatedly stacked at least twice, wherein, the thin layer A is comprised of $Ti_xAl_{1-x}N (0.5 \leq x \leq 0.7)$, the thin layer B is comprised of $Al_{1-y-z}Ti_yMe_zN$ ($0.4 \leq y \leq 0.7$, $0 < z \leq 0.1$ where Me is at least one of Si, Cr, and Nb), the thin layer C is comprised of $Al_aTi_{1-a}N (0.5 < a \leq 0.7)$, and the thin layer D is comprised of $Al_bCr_{1-b}N (0.5 \leq b \leq 0.7)$.

2. The hard film of claim 1, wherein each of the thin layer A, the thin layer B, the thin layer C and the thin layer D has an average thickness of 3 nm to 50 nm.

3. The hard film of claim 1, wherein each of the thin layer A, the thin layer B, the thin layer C and the thin layer D has an average thickness of 20 nm to 40 nm.

4. The hard film of claim 1, wherein the hard film has an average thickness of 1 μm to 20 μm.

5. The hard film of claim 1, wherein the hard film has a degradation hardness not less than 35 GPa or more when degradation-treated at a temperature of 900° C. for 30 minutes.

* * * * *